United States Patent
Yokoyama et al.

(10) Patent No.: US 7,084,797 B2
(45) Date of Patent: Aug. 1, 2006

(54) DELTA SIGMA MODULATING APPARATUS

(75) Inventors: Akio Yokoyama, Ibaraki (JP); Hitoshi Kobayashi, Hirakata (JP); Fumihito Inukai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/973,254

(22) Filed: Oct. 27, 2004

(65) Prior Publication Data

US 2005/0088327 A1 Apr. 28, 2005

(30) Foreign Application Priority Data

Oct. 28, 2003 (JP) .............................. 2003-366836

(51) Int. Cl.
*H03M 3/00* (2006.01)
(52) U.S. Cl. ...................................... 341/143; 341/155
(58) Field of Classification Search ................ 341/143, 341/155
See application file for complete search history.

(56) References Cited

U.S. PATENT DOCUMENTS

| | | | | |
|---|---|---|---|---|
| 5,061,928 A | * | 10/1991 | Karema et al. ............. | 341/143 |
| 5,414,424 A | * | 5/1995 | Cabler ........................ | 341/143 |
| 5,442,353 A | * | 8/1995 | Jackson ...................... | 341/143 |
| 5,442,354 A | * | 8/1995 | Cabler ........................ | 341/143 |
| 5,574,455 A | * | 11/1996 | Hori et al. .................. | 341/144 |
| 5,598,158 A | * | 1/1997 | Linz ........................... | 341/143 |
| 5,870,048 A | * | 2/1999 | Kuo et al. .................. | 341/143 |
| 6,061,008 A | * | 5/2000 | Abbey ........................ | 341/143 |
| 6,150,969 A | * | 11/2000 | Melanson ................... | 341/143 |
| 6,275,177 B1 | * | 8/2001 | Ho et al. .................... | 341/143 |
| 6,538,588 B1 | * | 3/2003 | Bazarjani .................... | 341/143 |
| 6,570,518 B1 | * | 5/2003 | Riley et al. ................. | 341/143 |
| 6,587,060 B1 | * | 7/2003 | Abbey ........................ | 341/143 |
| 6,762,703 B1 | * | 7/2004 | Tabatabaei .................. | 341/143 |

FOREIGN PATENT DOCUMENTS

JP 02126727 5/1990
JP 07202707 8/1995

OTHER PUBLICATIONS

Inukai et al. (U.S. Appl. No. 10/865,885), "Cascade delta sigma modulator", filed on Jun. 14, 2004.*

* cited by examiner

*Primary Examiner*—Jean Bruner Jeanglaude
(74) *Attorney, Agent, or Firm*—Stevens, Davis, Miller & Mosher, LLP

(57) ABSTRACT

A first second- or higher-order delta sigma modulator and a second second- or higher-order delta sigma modulator having a notch characteristic are cascaded together, and a delayed signal of the output of the first delta sigma modulator and a differential signal of the output of the second delta sigma modulator are added together. The amount of feedback from the output portion to the input portion of the first delta sigma modulator and the amount of feedback from the output portion to the input portion of the second delta sigma modulator are made the same.

2 Claims, 12 Drawing Sheets

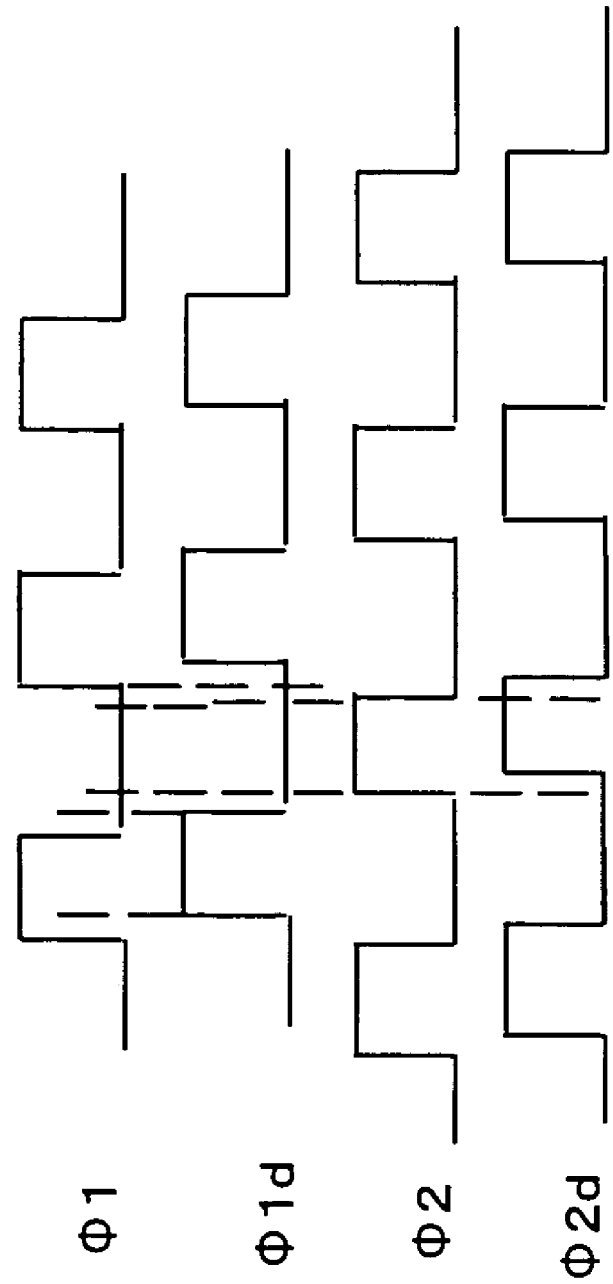

DELTA SIGMA MODULATING APPARATUS

BACKGROUND OF THE INVENTION

1. Field of the Invention

The present invention relates to a delta sigma modulating apparatus applied to a delta sigma analog-to-digital (AD) converter used in the fields of audio, communications and the like. More specifically, the present invention relates to a delta sigma modulating apparatus in which two or more stages of delta sigma modulators are cascaded together.

2. Prior Art

Over sampling AD converters frequently called delta sigma AD converters have previously been known. Delta sigma AD converters convert analog signals into digital signals at an extremely high over sampling rate and perform noise shaping to push noise away to a high frequency region, and after the noise shaping, perform digital filtering processing. By this, delta sigma AD converters can realize a higher effective resolution than the quantization output of delta sigma converters. Thereafter, the effective sampling rate is returned to a Nyquist rate by use of decimation.

FIG. 2 is a block diagram showing a typical cascade-type delta sigma AD converter. In FIG. 2, reference designations A1, A2 and A3 represent delta sigma modulators. The delta sigma modulators A1, A2 and A3 which comprise first- or second-order delta sigma modulators are cascaded together, and an analog input AIN is externally supplied to the delta sigma modulator A1 in the first stage.

It is known that first- or second-order delta sigma modulators are stable. Therefore, by cascading a plurality of first- or second-order delta sigma modulators and using a high-order modulator as a result, the effect of noise shaping is enhanced to thereby reduce the noise level of the pass band.

Reference designations $\Delta 1$ and $\Delta 2$ represent differentiators that differentiate the output signals of the delta sigma modulators A1 and A2, respectively. Reference designation F represents an adder that subtracts the output signals of the differentiators $\Delta 1$ and $\Delta 2$ from the output signal of the delta sigma modulator A1 in the first stage. Reference designation DF represents a digital decimation filter that performs decimation processing on the output signal of the adder F. Reference designation T represents a delay element that delays the output signal of the digital decimation filter DF. A digital output DOUT is obtained from the delay element D.

As described above, the differentiators $\Delta 1$ and $\Delta 2$ and the adder F are provided and the output signal of the delta sigma modulator A1 in the first stage and the differential signals of the output signals of the delta sigma modulators A2 and A3 in the second and third stages are added together. By this, the quantization noise of the delta sigma modulator A1 in the preceding stage is deleted, the quantization noise A3 in the last stage is pushed away to a high frequency region, and then, the noise that is pushed away to the high-frequency side is removed by the digital decimation filter DF. Consequently, a high signal-to-noise ratio can be realized.

FIG. 3 is a block diagram showing an example of the prior art delta sigma modulating apparatus. This delta sigma modulating apparatus comprises two stages of second-order delta sigma modulators (noise shaping circuits) that are cascaded together. This art is described, for example, in Japanese Published Patent Application H08-028666 and U.S. Pat. No. 5,061,928.

In FIG. 3, reference numeral 1 represents an input terminal, reference numerals 3, 6, 14, 17, 26 and 28 represent adders, reference numerals 5, 7, 16 and 18 represent integrators, and reference numerals 8 and 19 represent quantizers. Reference numerals 100 and 101 represent digital-to-analog (DA) converters. Reference numerals 11, 12, 13, 21, 22 and 25 represent computing elements, reference numerals 9 and 10 represent delay elements, and reference numerals 23 and 24 represent differentiators. Reference numeral 27 represents an output terminal.

The adder 3 subtracts the analog signal outputted from the DA converter 100, from the analog signal added through the input terminal 1. The integrator 5 integrates the analog signal outputted from the adder 3. The adder 6 subtracts the analog signal outputted from the DA converter 100, from the analog signal outputted from the integrator 5. The integrator 7 integrates the analog signal outputted from the adder 6. The quantizer 8 outputs a digital signal corresponding to the analog signal outputted from the integrator 7. The DA converter 100 outputs an analog signal corresponding to the digital output signal of the quantizer 8, and inputs it to the adders 3 and 6.

The computing element 11, which determines the amount of analog feedback from the quantizer 8 to the adder 3, multiplies the analog output signal of the DA converter 100 by a1 times, and inputs the result to the adder 3. The computing element 12, which determines the amount of analog feedback from the quantizer 8 to the adder 6, multiplies the analog output signal of the DA converter 100 by a2 times, and inputs the result to the adder 6.

The adder 28 subtracts the analog signal outputted from the DA converter 100, from the analog signal outputted from the integrator 7.

The delta sigma modulator A1 in the first stage is thus structured.

The computing element 13 performs scaling to multiply the analog signal outputted from the adder 28 by 1/c time and output the result. The adder 14 subtracts the analog signal outputted from the DA converter 101, from the analog signal outputted from the computing element 13. The integrator 16 integrates the analog signal outputted from the adder 14. The adder 17 subtracts the analog signal outputted from the DA converter 101, from the analog signal outputted from the integrator 16. The integrator 18 integrates the analog signal outputted from the adder 17. The quantizer 19 outputs a digital signal corresponding to the analog signal outputted from the integrator 18. The DA converter 101 outputs an analog signal corresponding to the digital output signal of the quantizer 19, and inputs it to the adders 14 and 17.

The computing element 21, which determines the amount of analog feedback from the quantizer 19 to the adder 14, multiplies the analog output signal of the DA converter 101 by a3 times, and inputs the result to the adder 14. The computing element 22, which determines the amount of analog feedback from the quantizer 19 to the adder 17, multiplies the analog output signal of the DA converter 101 by a4 times, and inputs the result to the adder 17.

The delta sigma modulator A2 in the second stage is thus structured.

The delay elements 9 and 10 which are cascaded together delay the digital output signal of the quantizer 8 by two clocks. The differentiators 23 and 24 which are cascaded together differentiate the analog output signal of the quantizer 19. The differentiator $\Delta 1$ is thus structured.

The computing element 25 performs scaling to multiply the output signal of the differentiator $\Delta 1$ by c times and output the result.

The adder 26 adds the output signal of the delay element 10 and the output signal of the computing element 25 together, and supplies the result to the output terminal 27.

In the above structure, the delta sigma modulating apparatus operates as follows: The signal obtained by multiplying the analog output signal of the DA converter 100 by a1 times by the computing element 11 is subtracted, by the adder 3, from the analog input signal added to the input terminal 1. The analog output signal of the adder 3 is integrated by the integrator 5.

The signal obtained by multiplying the analog output signal of the DA converter 100 by a2 times by the computing element 12 is subtracted from the analog output signal of the integrator 5 by the adder 6. The analog output signal of the adder 6 is integrated by the integrator 7.

The output signal of the differentiator 7 is analog-to-digital converted by the quantizer 8, and inputted to the adder 26 via the delay elements 9 and 10.

The analog output signal of the DA converter 100 is subtracted from the output signal of the integrator 7 by the adder 28. By this, only the quantization noise of the quantizer 1 is added to the delta sigma modulator (second-order noise shaping modulator) in the second stage. At this time, the output signal of the adder 28 is scaled by the computing element 13. That is, the voltage level of the output signal of the adder 28 is reduced to 1/c (c>1) by the computing element 13.

Then, the signal obtained by multiplying the analog output signal of the DA converter 101 by a3 times by the computing element 21 is subtracted, by the adder 14, from the analog signal scaled by the computing element 13. The analog output signal of the adder 14 is integrated by the integrator 16.

The signal obtained by multiplying the analog output signal of the DA converter 101 by a4 times by the computing element 22 is subtracted from the analog output signal of the integrator 16 by the adder 17. The analog output signal of the adder 17 is integrated by the integrator 18.

The output signal of the integrator 18 is analog-to-digital converted by the quantizer 19 and differentiated by the differentiators 23 and 24, and then, multiplied by c times by the computing element 25 that performs scaling and inputted to the adder 26.

Then, the output signal of the delay element 10 and the output signal of the computing element 25 are added together by the adder 26, and the result is outputted from the output terminal 27.

Here, the part from the input terminal 1 to the output of the quantizer 8 constitutes the second-order delta sigma modulator A1. Moreover, the part from the input of the computing element 13 to the output of the quantizer 19 constitutes the second-order delta sigma modulator A2.

When the input of the delta sigma modulator A1 is X, the output thereof is y1, the output of the delta sigma modulator A2 is y2, the quantization noise of the quantizer 8 is E1, the quantization noise of the quantizer 19 is E2, the values of the gain coefficients a1 and a2 of the computing elements 11 and 21 are both 1 and the values of the gain coefficients a2 and a4 of the computing elements 12 and 22 are both 2, the output y1 of the delta sigma modulator A1 is expressed by the following expression (1):

$$y1 = Z^{-2}X + (1-Z^{-1})^2 E1 \quad (1)$$

On the other hand, the output y2 of the quantizer 19 is expressed by the following expression (2):

$$y2 = -Z^{-2}E1/C + (1-Z^{-1})^2 E2 \quad (2)$$

Moreover, the output y3 of the computing element 25 constituting the scaling factor is expressed by the following expression (3):

$$y3 = -(1-Z^{-1})^2 Z^{-2} E1 + C(1-Z^{-1})^4 E2 \quad (3)$$

Therefore, the output y that appears at the output terminal 27 is expressed by the following condition (4):

$$y = Z^{-4}X + C(1-Z^{-1})^4 E2 \quad (4)$$

As is well known to persons skilled in the art, the quantization noise of the output is only the quantization noise of the quantizer 19 in the succeeding stage that is shaped to a fourth-order high frequency region.

FIG. 4 is a block diagram showing another prior art. This example is described in Japanese Laid-Open Patent Application No. H 07-202707. Although detailed description thereof is omitted, a difference from FIG. 3 is that the adder 28 in cascading the delta sigma modulator A1 in the first stage to the delta sigma modulator A2 in the second stage is deleted, a digital adder 29A is provided instead and similar processing to that performed by the adder 28 is performed by the digital adder 29A. This reduces the number of capacitors, so that the manufacturing cost can be reduced.

Conventionally, in cascade-type delta sigma modulators, to achieve excellent resolution, it is necessary that the characteristics of the delta sigma modulators strictly coincide with each other. In particular, when the characteristics of analog parts are not strictly matched, undeleted quantization noise leaks into the pass band.

As the analog circuit of the delta sigma modulator, typically, a switched capacitor circuit is frequently used, and it is known that the characteristics are degraded by a mismatch between capacitors. To suppress such characteristic degradation, that is, to secure a large margin, the order of the delta sigma modulator is made higher.

Description will be given with reference to FIG. 3. When the input is X and the output of the quantizer 8 is y1, the following expression (5) holds:

$$y1 = \{Z^{-2}X + (1-Z^{-1})^2 E1\}/\{1+(a2-2)Z^{-1}+(1+a1-a2)Z^{-2}\} \quad (5)$$

Further, when the output of the quantizer 19 is y2, the following expression (6) holds:

$$y2 = \{-Z^{-2}E1/C + (1-Z^{-1})^2 E2\}/\{1+(a4-2)Z^{-1}+(1+a3-a4)Z^{-2}\} \quad (6)$$

Therefore, the output y of the adder 26 is expressed by the following expression (7):

$$\begin{aligned} y &= Z^{-2}y1 + C(1-Z^{-1})y2 \\ &= \{Z^{-4} + Z^{-2}(1-Z^{-1})^2 E1\}/ \\ &\quad \{1+(a2-2)Z^{-1}+(1+a1-a2)Z^{-2}\} + (1-Z^{-1}) \\ &\quad \{-Z^{-2}E1 + C(1-Z^{-1})^2 E2\}/ \\ &\quad \{1+(a4-2)Z^{-1}+(1+a3-a4)Z^{-2}\} \end{aligned} \quad (7)$$

Here, paying attention to the coefficient $k=\Delta y/\Delta E1$ of the term of the quantization noise E1, the following expression (8) is obtained:

$$k = Z^{-3}(1-Z^{-1})^2[(a4-a2)+(a3-a1-a4+a2)Z^{-1}]/[1+(a2-2)Z^{-1}+(1+a1-a2)Z^{-2}]\{1+(a4-2)Z^{-1}+(1+a3-a4)Z^{-2}\} \quad (8)$$

Here, when a4=a2=2 and a3=a1=1, k is zero, and expression (7) coincides with the expression (4). However, assuming now that a4−a2=a3−a1=ΔA, the following expression (9) is obtained:

$$k = \Delta A Z^{-3}(1-Z^{-1})^2/[1+(a2-2)Z^{-1}+(1+a1-a2)Z^{-2}]\{1+(a4-2)Z^{-1}+(1+a3-a4)Z^{-2}\} \quad (9)$$

Therefore, it is understood that, although the effect of fourth-order noise shaping is originally expected, only second-order noise shaping in which the quantization noise E1 is attenuated is performed and characteristics are degraded. This also applies to FIG. 4.

SUMMARY OF THE INVENTION

Based on the premise that the noise of the quantizer in the preceding stage is not completely removed by a digital circuit in a delta sigma modulating apparatus, an object of the present invention is to provide a delta sigma modulating apparatus capable of performing necessary and sufficient noise shaping on the quantization noise of the preceding stage by the succeeding stage.

Another object of the present invention is to provide a delta sigma modulating apparatus in which the quantization noise of the preceding stage can be minimized by minimizing the number of analog adders and the number of digital adders.

Still another object of the present invention is to provide a delta sigma modulating apparatus in which even when there is a mismatch between the modulators in the stages, the quantization noise can be reduced by reducing the influence of the mismatch on the overall characteristics.

To solve the above-mentioned problems, a delta sigma modulating apparatus according to a first aspect of the invention is provided with a first delta sigma modulator, a second delta sigma modulator and a signal synthesizer.

The first delta sigma modulator includes a first and a second adder, a first and a second integrator, a first quantizer and a first DA converter. The second delta sigma modulator includes a third and a fourth adder, a third and a fourth integrator, a second quantizer and a second DA converter. The signal synthesizer synthesizes the output signal of the first delta sigma modulator with the output signal of the second delta sigma modulator.

The first adder subtracts the analog output signal of the first DA converter from the externally inputted analog input signal. The first integrator integrates the analog output signal of the first adder. The second adder subtracts the analog output signal of the first DA converter from the analog output signal of the first integrator. The second integrator integrates the analog output signal of the second adder. The first quantizer outputs a digital signal corresponding to the analog output signal of the second integrator. The first DA converter outputs an analog signal corresponding to the digital output signal of the first quantizer and inputs the analog signal to the first and second adders.

The third adder subtracts the analog output signal of the second DA converter and the analog output signal of the fourth integrator from the analog output signal of the second integrator. The third integrator integrates the analog output signal of the third adder. The fourth adder subtracts the output signal of the second DA converter from the analog output signal of the third integrator. The fourth integrator integrates the analog output signal of the fourth adder. The second quantizer outputs a digital signal corresponding to the analog output signal of the fourth integrator. The second DA converter outputs an analog signal corresponding to the digital output signal of the second quantizer and inputs the analog signal to the third and fourth adders.

The signal synthesizer adds the signal obtained by delaying the digital output signal of the first quantizer to the signal obtained by differentiating the digital output signal of the second quantizer and performing scaling on the result of the differentiation, and outputs the result of the addition.

In the above-described structure, it is preferable that the feedback amount of the analog signal inputted from the first quantizer to the first adder be the same as the feedback amount of the analog signal inputted from the second quantizer to the third adder. With this structure, the signal-to-noise (SN) ratio is excellent. When the feedback amounts are not the same, for example as shown in FIG. 10, ΔA is not zero and noise of the quantizer in the first stage largely leaks into the final output, so that the SN ratio is deteriorated.

According to this structure, the input of the quantizer of the preceding second-order delta sigma modulator is directly connected to the succeeding second-order delta sigma modulator having a notch characteristic, and fourth-order noise shaping in which the noise of the quantizer in the first stage is minimized is performed. This enables the realization of a high SN ratio. Moreover, the characteristic degradation with respect to the disagreement between the modulators in the stages which is a defect of the cascade type is reduced, and cost reduction can be realized.

Moreover, since the delta sigma modulator in the succeeding stage has a notch characteristic, even if the order is the same, by most suitably selecting the notch point, a higher SN ratio can be obtained than one having no notch characteristic.

A delta sigma modulating apparatus according to a second aspect of the invention is provided with a first delta sigma modulator, a second delta sigma modulator and a signal synthesizer.

The first delta sigma modulator includes a first and a second adder, a first and a second integrator, a first quantizer and a first DA converter.

The second delta sigma modulator includes a third and a fourth adder, a third and a fourth integrator, a second quantizer and a second DA converter.

The signal synthesizer synthesizes the output signal of the first delta sigma modulator with the output signal of the second delta sigma modulator.

The first adder subtracts the analog output signal of the first DA converter from the externally inputted analog input signal. The first integrator integrates the analog output signal of the first adder. The second adder subtracts the analog output signal of the first DA converter from the analog output signal of the first integrator. The second integrator integrates the analog output signal of the second adder. The first quantizer outputs a digital signal corresponding to the analog output signal of the second integrator. The first DA converter outputs an analog signal corresponding to the digital output signal of the first quantizer and inputs the analog signal to the first and second adders.

The third adder subtracts the analog output signal of the second DA converter from the analog output signal of the second integrator. The third integrator integrates the analog output signal of the third adder. The fourth adder subtracts the output signal of the second DA converter from the analog output signal of the third integrator. The fourth integrator integrates the analog output signal of the fourth adder. The second quantizer outputs a digital signal corresponding to the analog output signal of the fourth integrator. The second DA converter outputs an analog signal corresponding to the digital output signal of the second quantizer and inputs the analog signal to the third and fourth adders.

The signal synthesizer adds the signal obtained by delaying the digital output signal of the first quantizer to the signal obtained by differentiating the digital output signal of the second quantizer and performing scaling on the result of the differentiation, and outputs the result of the addition.

In the above-described structure, it is preferable that the feedback amount of the analog signal inputted from the first quantizer to the first adder be the same as the feedback amount of the analog signal inputted from the second quantizer to the third adder.

According to this structure, the realization of a high SN ratio is enabled by directly connecting the input of the quantizer of the preceding second-order delta sigma modulator to the succeeding second-order delta sigma modulator and performing fourth-order noise shaping in which the noise of the quantizer in the first stage is minimized. Moreover, the characteristic degradation with respect to the disagreement between the modulators in the stages which is a defect of the cascade type is reduced, and cost reduction can be realized.

As described above, according to the present invention, in a delta sigma modulating apparatus in which a plurality of delta sigma modulators is cascaded together, a delta sigma modulating apparatus can be provided that enables the realization of a high SN ratio by directly connecting the input of the quantizer of the preceding second-order delta sigma modulator to the second-order delta sigma modulator in the succeeding stage and performing fourth-order noise shaping in which the noise of the first quantizer is minimized. Moreover, a delta sigma modulating apparatus can be provided that reduces the characteristic degradation with respect to the disagreement between the modulators in the stages which is a defect of the cascade type, and is capable of realizing cost reduction.

BRIEF DESCRIPTION OF THE DRAWINGS

FIG. 11 is a time chart showing the operation of the integrator of FIG. 6.

DESCRIPTION OF THE PREFERRED EMBODIMENT

Hereinafter, an embodiment of the present invention will be described with reference to the drawings.

Figure 1:
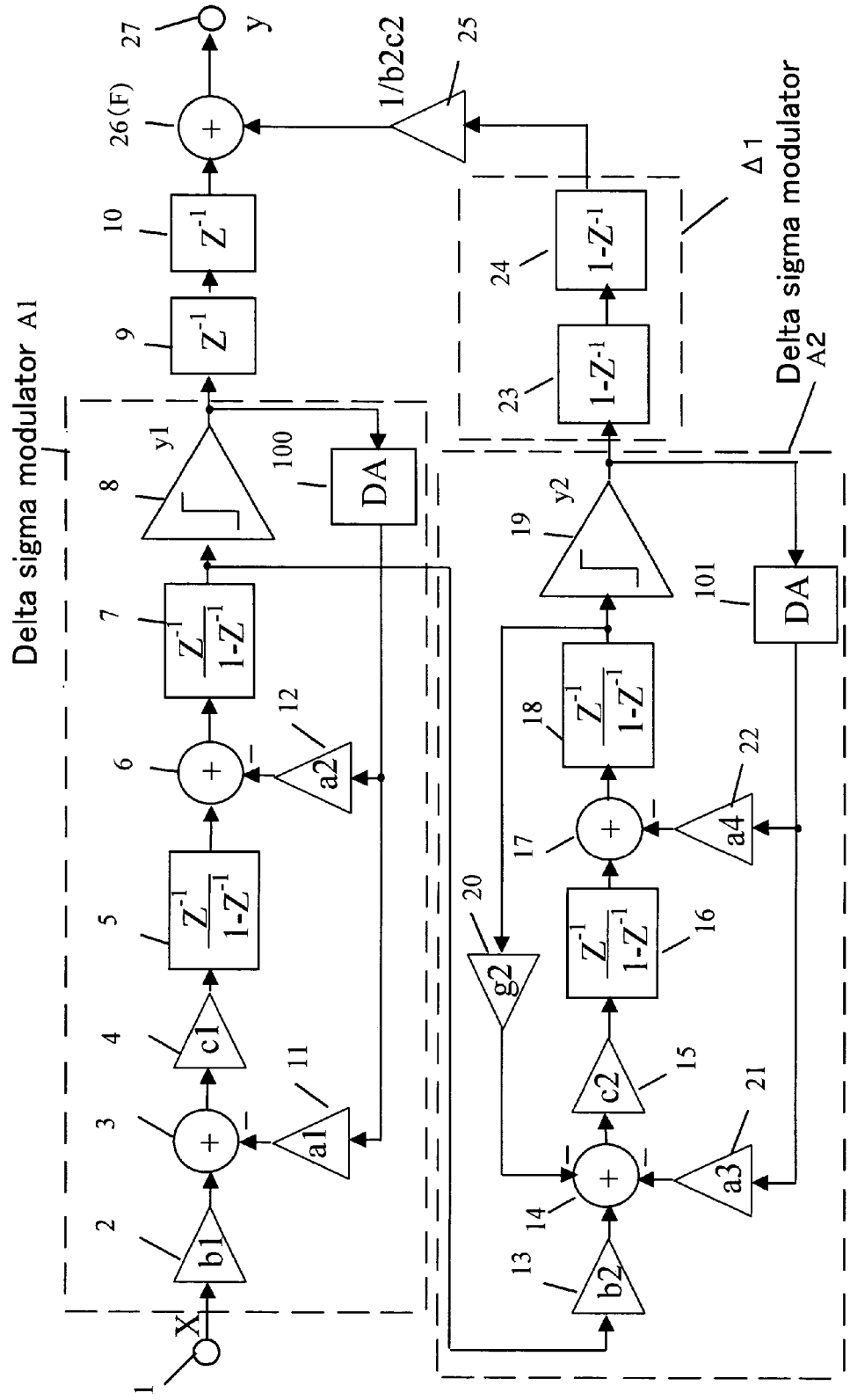
FIG. 1 is a block diagram showing the structure of a delta sigma modulating apparatus according to an embodiment of the present invention.

FIG. 1 is a block diagram showing the structure of a delta sigma modulating apparatus of the embodiment of the present invention. This delta sigma modulating apparatus comprises two stages of second-order delta sigma modulators (noise shaping circuits) that are cascaded together. Description will be given with reference to the drawings.

In FIG. 1, reference numeral 1 represents an input terminal. Reference numerals 2, 4, 13 and 15 represent computing elements, reference numerals 3, 6, 14, 17 and 26 represent adders, reference numerals 5, 7, 16 and 18 represent integrators, and reference numerals 8 and 19 represent quantizers. Reference numerals 100 and 101 represent DA converters. Reference numerals 11, 12, 20, 21, 22 and 25 represent computing elements, reference numerals 9 and 10 represent delay elements, and reference numerals 23 and 24 represent differentiators. Reference numeral 27 represents an output terminal.

The adder 3 subtracts the analog signal outputted from the DA converter 100, from the analog signal added through the input terminal 1. The integrator 5 integrates the analog signal outputted from the adder 3. The adder 6 subtracts the analog signal outputted from the DA converter 100, from the analog signal outputted from the integrator 5. The integrator 7 integrates the analog signal outputted from the adder 6. The quantizer 8 outputs a digital signal corresponding to the analog signal outputted from the integrator 7. The DA converter 100 outputs an analog signal corresponding to the digital output signal of the quantizer 8, and inputs it to the adders 3 and 6. The computing element 2, which performs scaling on the analog signal added through the input terminal 1, multiplies the analog signal by b1 times, and inputs the result to the adder 3. The computing element 11, which determines the amount of analog feedback from the quantizer 8 to the adder 3, multiplies the analog output signal of the DA converter 100 by a1 times, and inputs the result to the adder 3. The computing element 4, which performs scaling on the analog signal outputted from the adder 3, multiplies the analog signal by c1 times, and inputs the result to the integrator 5. The computing element 12, which determines the amount of analog feedback from the quantizer 8 to the adder 6, multiplies the analog output signal of the DA converter 100 by a2 times, and inputs the result to the adder 6. The delta sigma modulator A1 in the first stage is thus structured.

The computing element 13, which performs scaling on the analog signal outputted from the integrator 7, multiplies the analog signal by b2 times, and inputs the result to the adder 14. The adder 14 subtracts the analog signal outputted from the DA converter 101 and the analog signal outputted from the integrator 18, from the analog signal outputted from the computing element 13. The integrator 16 integrates the analog signal outputted from the adder 14. The adder 17 subtracts the analog signal outputted from the DA converter 101, from the analog signal outputted from the integrator 16. The integrator 18 integrates the analog signal outputted from the adder 17. The quantizer 19 outputs a digital signal corresponding to the analog signal outputted from the integrator 18. The DA converter 101 outputs an analog signal corresponding to the digital output signal of the quantizer 19, and inputs it to the adders 14 and 17. The computing element 15, which performs scaling on the analog signal outputted from the adder 14, multiplies the analog signal by c2 times, and inputs the result to the integrator 16. The computing element 21, which determines the amount of analog feedback from the quantizer 19 to the adder 14, multiplies the analog output signal of the DA converter 101 by a3 times, and inputs the result to the adder 14. The computing element 22, which determines the amount of analog feedback from the quantizer 19 to the adder 17, multiplies the analog output signal of the DA converter 101 by a4 times, and inputs the result to the adder 17. The computing element 20, which determines the amount of feedback from the integrator 18 to the adder 14, multiplies the analog output signal of the integrator 18 by g2 times, and inputs the result to the adder 14. The delta sigma modulator A2 having a notch characteristic in the second stage is thus structured.

The delay elements 9 and 10 which are cascaded together delay the digital output signal of the quantizer 8 by two clocks. The differentiators 23 and 24 which are cascaded together differentiate the analog output signal of the quantizer 19. The differentiator Δ1 is thus structured.

The computing element 25 performs scaling to multiply the output signal of the differentiator Δ1 by 1/(b2c2) time and output the result.

Figure 2:
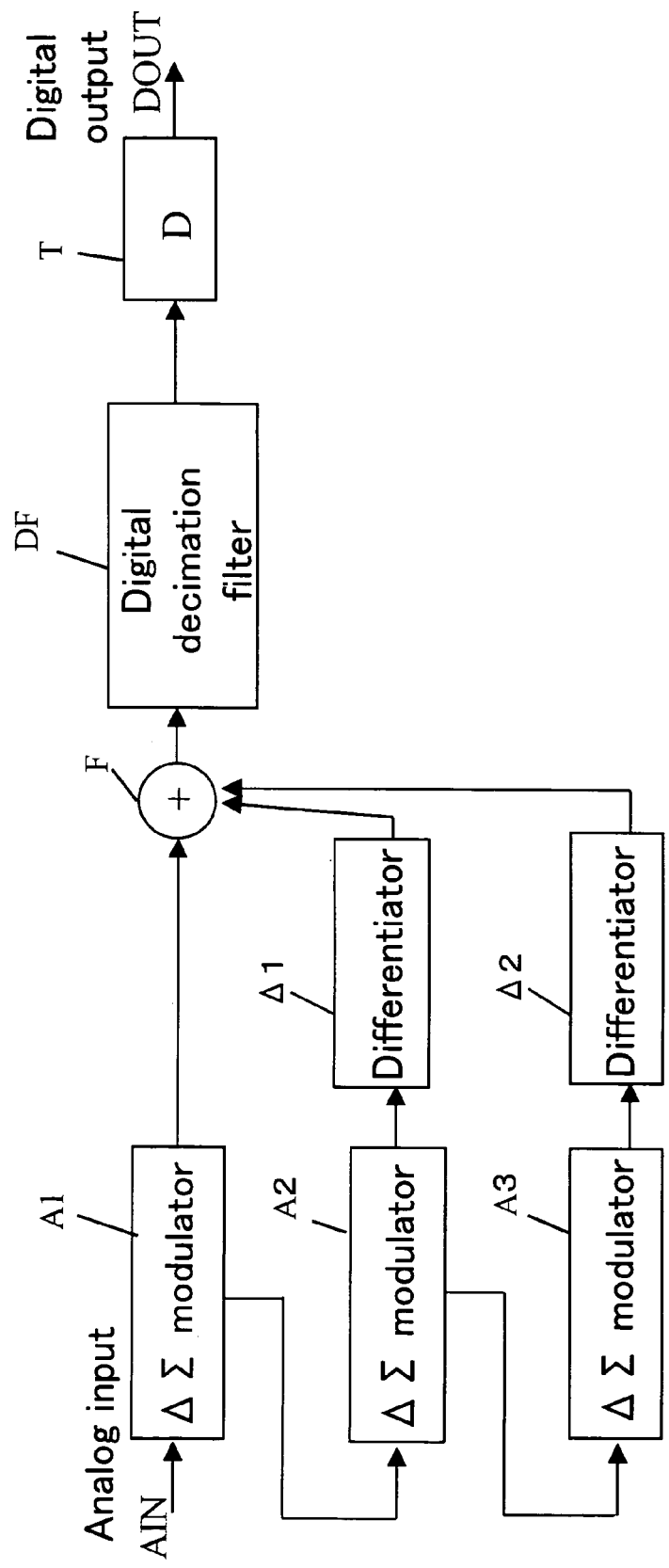
FIG. 2 is a block diagram showing the prior art delta sigma modulating apparatus.

The adder 26, which corresponds to the adder F of FIG. 2, adds the output signal of the delay element 10 and the output signal of the computing element 25 together, and supplies the result to the output terminal 27.

In the above structure, the delta sigma modulating apparatus operates as follows: In the delta sigma modulator A1 in the first stage, the signal obtained by multiplying the analog output signal of the DA converter 100 by a1 times by the computing element 11 is subtracted, by the adder 3, from the signal obtained by multiplying the analog input signal added to the input terminal 1 by b1 times by the computing element 2. The analog output signal of the adder 3 is multiplied by c1 times by the computing element 4, and then, integrated by the integrator 5.

The signal obtained by multiplying the analog output signal of the DA converter 100 by a2 times is subtracted from the analog output signal of the integrator 5 by the adder 6. The analog output signal of the adder 6 is integrated by the integrator 7.

The output signal of the integrator 7 is analog-to-digital converted by the quantizer 8, and inputted to the adder 26 via the delay elements 9 and 10.

The output signal of the integrator 7 is added to the delta sigma modulator (second-order noise shaping modulator) A2 in the succeeding stage. At this time, the output signal of the integrator 7 is scaled by the computing element 13. That is, the voltage level of the output signal of the integrator 7 is multiplied by b2 times by the computing element 13.

Then, the signal obtained by multiplying the analog output signal of the DA converter 101 by a3 times by the computing element 21 and the signal obtained by multiplying the analog output signal of the integrator 18 by g2 times by the computing element 20 are subtracted, by the adder 14, from the analog signal scaled by the computing element 13. The analog output signal of the adder 14 is multiplied by c2 times by the computing element 15, and then, integrated by the integrator 16.

The signal obtained by multiplying the analog output signal of the DA converter 101 by a4 times by the computing element 22 is subtracted from the analog output signal of the integrator 16 by the adder 17. The analog output signal of the adder 17 is integrated by the integrator 18.

The output signal of the integrator 18 is analog-to-digital converted by the quantizer 19 and differentiated by the differentiators 23 and 24, and then, multiplied by 1/(b2·c2) time by the computing element 25 that performs scaling and inputted to the adder 26.

Then, the output signals of the delay elements 9 and 10 and the output signal of the computing element 25 are added together by the adder 26, and the result is outputted from the output terminal 27.

As described above, the part from the input terminal 1 to the output of the quantizer 8 constitutes the second-order delta sigma modulator A1. Moreover, the part from the input of the computing element 13 to the output of the quantizer 19 constitutes the second-order delta sigma modulator A2 having a notch characteristic.

When the input of the delta sigma modulator A1 is X, the output thereof is y1, the output of the delta sigma modulator A2 is y2, the quantization noise of the quantizer 8 is E1, the quantization noise of the quantizer 19 is E2, the gain coefficients of the computing elements 11, 12, 21 and 22 are a1, a2, a3 and a4 and the values of the computing elements 2, 4, 13, 15 and 20 are b1, c1, b2, c2 and g2, the output y1 of the delta sigma modulator A1 is expressed by the following expression (10):

$$y1 = k1 Z^{-2} X / D1(Z) + N1(Z) E1 / D1(Z) \tag{10}$$

Here, k1, N1(Z) and D1(Z) are expressed by the following expressions (11), (12) and (13):

$$k1 = b1c1 \tag{11}$$

$$N1(Z) = (1 - Z^{-1})^2 \tag{12}$$

$$D1(Z) = 1 - (2-a2)Z^{-1} + (1-a2+a1c1)Z^{-2} \tag{13}$$

On the other hand, the output y2 of the delta sigma modulator A2 (the output of the quantizer 19) is expressed by the following expression (14):

$$y2 = k2 Z^{-2} (y1 - E1) / D2(Z) + N2(Z) E2 / D2(Z) \tag{14}$$

Here, k2, N2(Z) and D2(Z) are expressed by the following expressions (15), (16) and (17):

$$k2 = b2c2 \tag{15}$$

$$N2(Z) = (1 - Z^{-1})^2 + c2g2 \tag{16}$$

$$D2(Z) = 1 - (2-a4)Z^{-1} + (1+c2g2-a4+a3c2)Z^{-2} \tag{17}$$

Therefore, the output y that appears at the output terminal 27 is expressed by the following expression (18):

$$y = k1 Z^{-4} (1 + N1(Z)/D2(Z)) X/D1(Z) + N1(Z) N2(Z) E2/D2(Z) + Z^{-2} N1(Z)/(D1(Z)D2(Z)) * [D2(Z) - D1(Z) + N1(Z)] * E1 \tag{18}$$

Here, the first term of the expression (18) represents a signal component. In the conventional example, the coefficient of X is 1 in ideal state. However, in the present embodiment, although k1=1, the coefficient of X is basically not 1 because of the term of N1(Z)/[D1(Z)D2(Z)]. However, the term of N1(Z)/[D1(Z)D2(Z)] can be made substantially zero in the pass band by adopting a necessary over sampling ratio.

Moreover, the N1(Z)N2(Z)/D2(Z) of the second term represents the noise shaping characteristic of the second quantizer 19.

Moreover, the third term represents the noise shaping characteristic of the quantization noise E1.

Here, the noise in the pass band is minimized when the zero point of D2(Z)−D1(Z)+N1(Z) and the zero point of N2(Z) become the same. For this reason, this is an object of the present invention.

Figure 5:
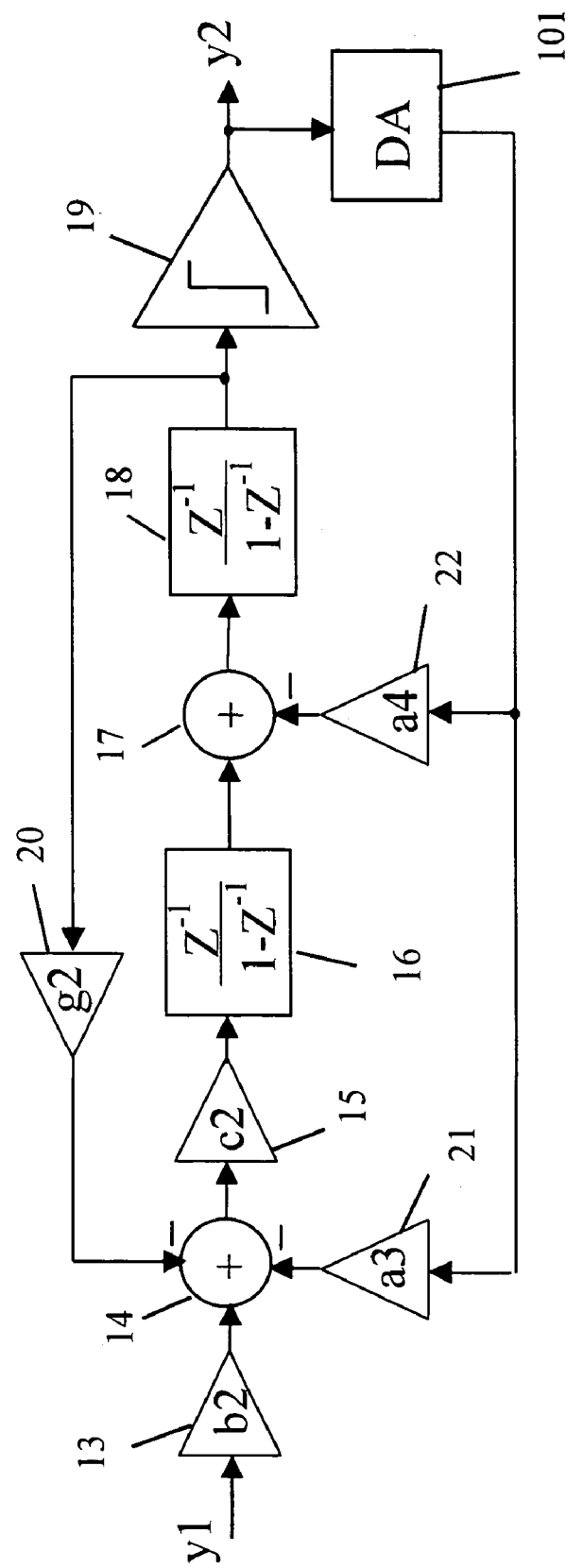
FIG. 5 is a block diagram showing the structure of a second-order delta sigma modulator having a notch characteristic.

FIG. 5 shows an example of the second-order delta sigma modulator having a notch characteristic. The elements of FIG. 5 are the same as those of the delta sigma modulator A2 shown in FIG. 1. Reference designation X3 represents the input, and reference designation y2 represents the output.

When the input of the delta sigma modulator A2 is y1, the noise of the quantizer 19 is E2 and the output is y2, the output y2 of the delta sigma modulator is expressed by the following expression (14):

$$y2 = k2Z^{-2}(y1-E1)/D2(Z) + N2(Z)E2/D2(Z) \quad (14)$$

Here, k2, N2(Z) and D2(Z) are expressed by the following expressions (15), (16) and (17):

$$k2 = b2c2 \quad (15)$$

$$N2(Z) = (1-Z^{-1})^2 + c2g2 \quad (16)$$

$$D2(Z) = 1 - (2-a4)Z^{-1} + (1+c2g2-a4+a3c2)Z^{-2} \quad (17)$$

Moreover, N2(Z) has the zero point at a frequency of $f0 = \{(c2g2)^{1/2}/2\pi\}*fs$. Here, fs is the sampling frequency.

Thus, a frequency f0 that minimizes the noise in the pass band is present. For example, when a path of feedback from the integrator 19 via the computing element 20 to the adder 14 is provided and the amount of feedback of the analog signal inputting from the DA converter 100 to the adder 3 and the amount of feedback of the analog signal inputted from the DA converter 101 to the adder 14 are the same (claim 2), $$D2(Z) - D1(Z) + N1(Z) = (a4-a2)Z^{-1} + (c2g2-a4+a2+a3c2-a1c1)Z^{-2} + (1-Z^{-1})^2 \quad (19)$$

Here, when a4=a2, a3=a1 and c2=c1, the expression (19) has the same zero point as N2(Z), and at this time, the noise in the pass band can be minimized.

Now a case where there is an error between the two delta sigma modulators will be considered. For the sake of simplicity, $$a4-a2 = a3-a1 = \Delta A$$

$$c2 = c1 = c$$

In this case, $$N3(Z) = D2(Z) - D1(Z) + N1(Z) = [1+(\Delta A-2)Z^{-1} + (cg2+\Delta A(c-1)+1)]Z^{-2} \quad (20)$$

As is apparent from the expression (20), second-order noise shaping is also performed on this term even when there is an error between the delta sigma modulators. Therefore, a fourth-order noise shaping as expressed by $$N1(Z)N3(Z)/D1(Z)/D2(Z)$$

is performed on the quantization noise E1 as a result. That is, to achieve the fourth-order noise shaping, it is unnecessary that the feedback amount of the analog signal inputted from the DA converter 100 to the adder 3 and the feedback amount of the analog signal inputted from the DA converter 101 to the adder 14 be the same, but they may be different to some extent.

Figure 10:
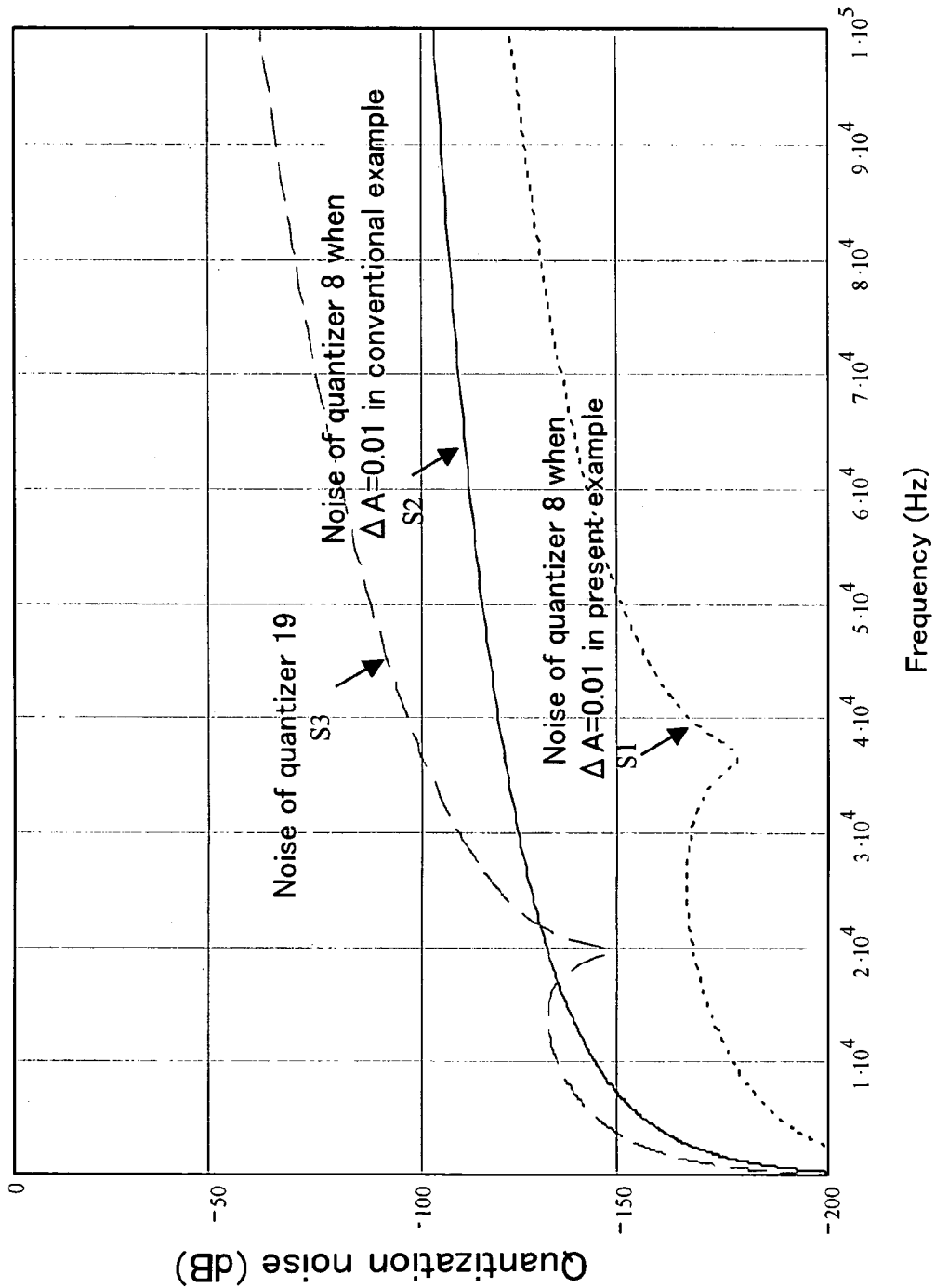
FIG. 10 is a characteristic view showing the spectra of quantization noise in the delta sigma modulators of the present invention and the prior art.

In FIG. 10, the characteristic of the quantization noise E1 of the quantizer 8 when $\Delta A=0.01$ in the structure of the prior art is shown by the solid line S2. In the figure, the characteristic of the quantization noise E1 of the quantizer 8 when $\Delta A=0.01$ in the structure of the embodiment of the present invention is shown by the broken line S1. Comparing the broken line S1 with the solid line S2, it is understood that the influence of the quantization noise E1 is obviously smaller in the present invention.

The long broken line S2 shows the characteristic of the quantization noise E2 of the quantizer 19.

Thus, compared to the structure of the prior art, the degradation in characteristic is obviously lessened. This is another object of the present invention.

Figure 8A:
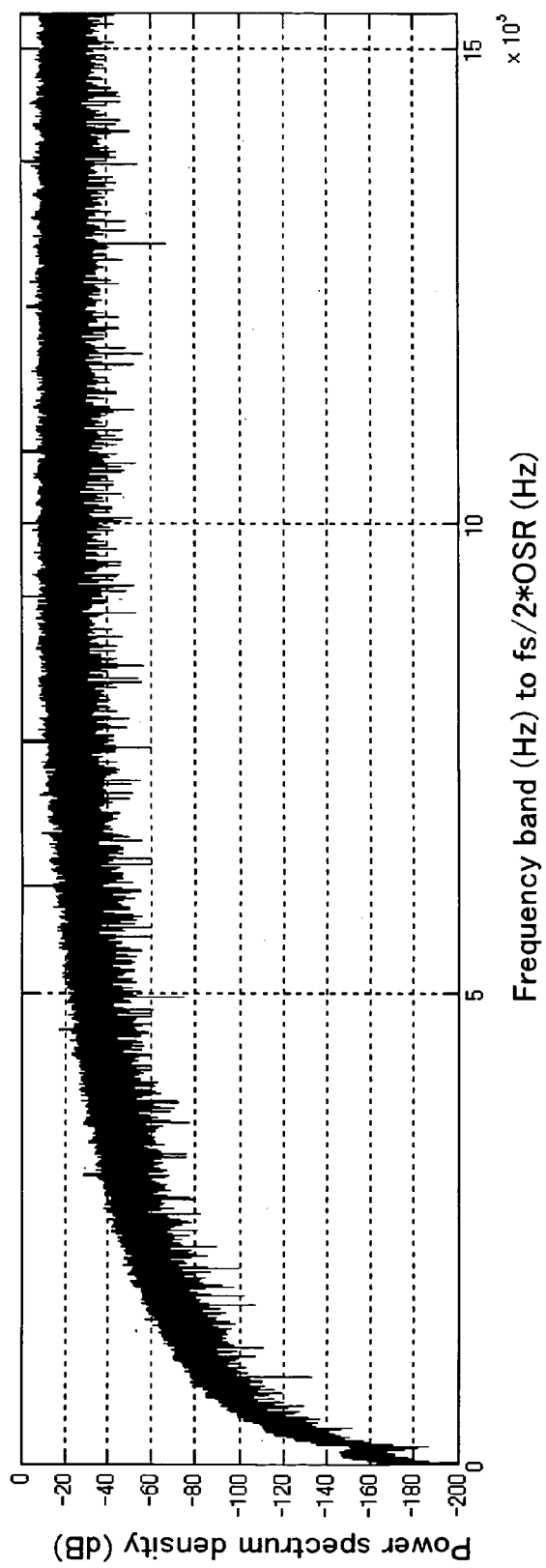
FIGS. 8A and 8B are characteristic views showing the spectra of quantization noise in the delta sigma modulating apparatus of the present invention.
Figure 8B:
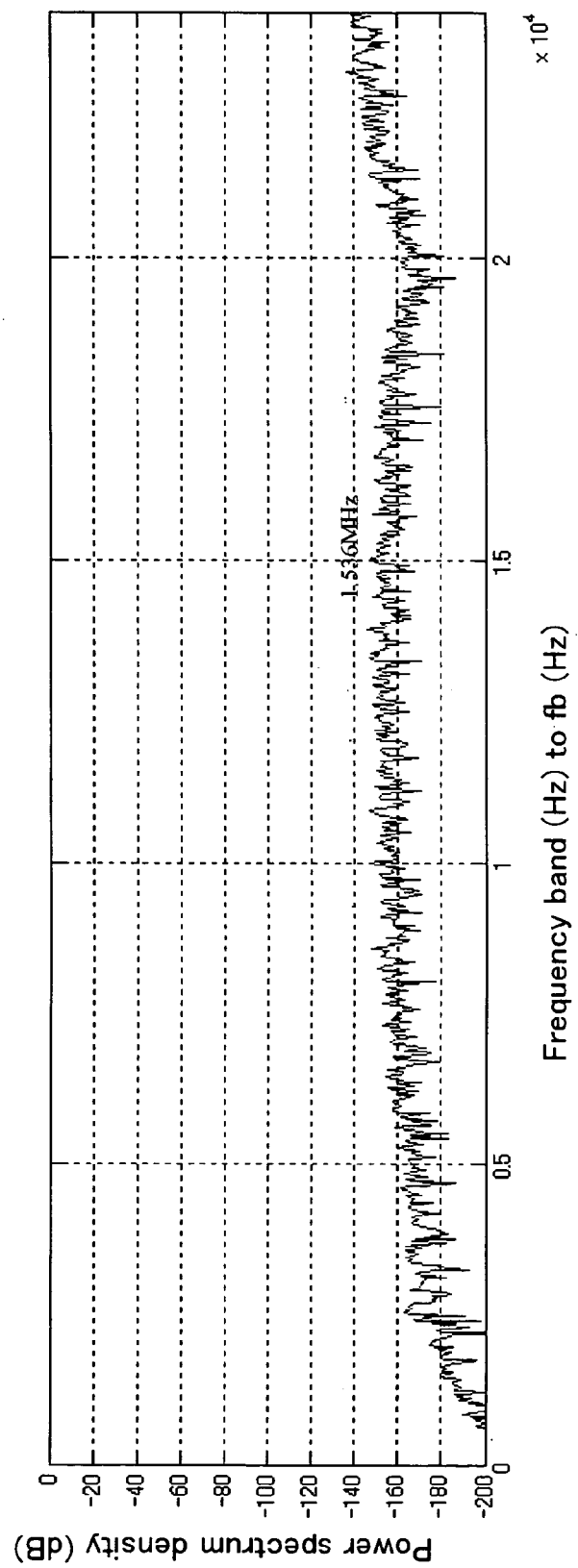

FIGS. 8A and 8B show the spectra of the quantization noise in the delta sigma modulating apparatus of the present invention. The zero point of the quantization noise is present at the origin and at a point of approximately 0.7 to 0.8 of the pass band, and the noise in the pass band can be minimized.

In FIGS. 8A and 8B, reference designation fs represents the sampling frequency, and reference designation OSR represents the over sampling ratio. Reference designation fs/2*OSR represents a frequency to ½ the actually sampled frequency. Reference numeral fb represents the pass band frequency. The unit of frequency is Hz.

In FIG. 8B, the pass band frequency fb is 0 to 24 kHz. In FIGS. 8A and 8B, the notch point is 19 kHz, at this time, 19/24 is approximately 0.79, and this is referred to as the point of approximately 0.7 to 0.8 as mentioned above.

Figure 9:
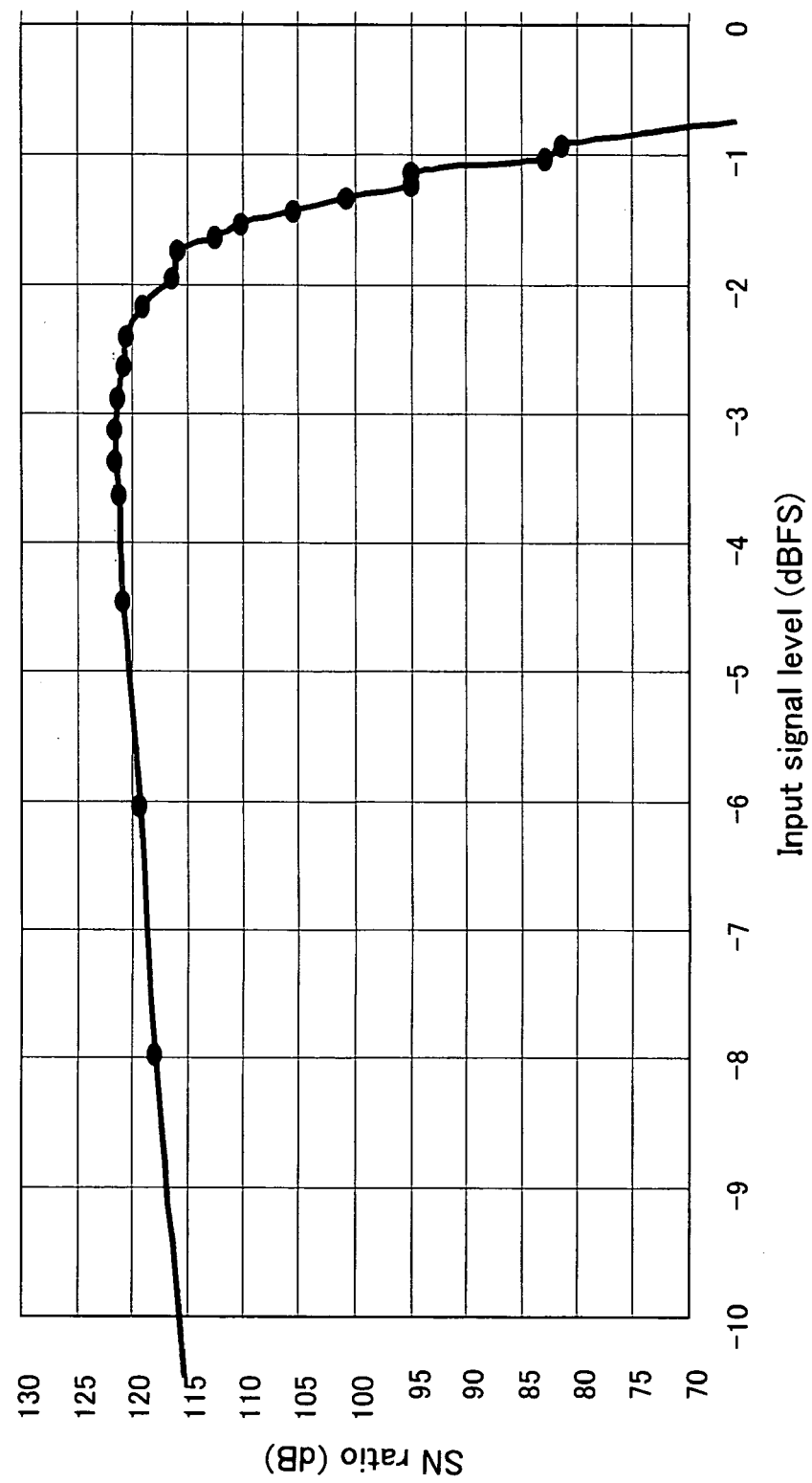
FIG. 9 is a characteristic view showing an ideal SN ratio in the delta sigma modulating apparatus of the present invention.

FIG. 9 shows an ideal SN ratio (signal-to-noise ratio) by the delta sigma modulating apparatus of the embodiment of the present invention. The longitudinal axis shows the SN ratio (dB), the lateral axis shows the input signal level (dBFS). FS is an abbreviation for full scale.

Further, in the present invention, the number of analog adders and the number of digital adders are smaller than in the prior art. For example, while the number of adders is six in the conventional example, in the present invention, the number is five, which is smaller by one. The reduction in the number of analog adders reduces mismatches between modulators, and reduces cost through a reduction in capacity.

Moreover, the reduction in the number of digital adders as well as the reduction in computing word length also reduces cost.

Figure 6:
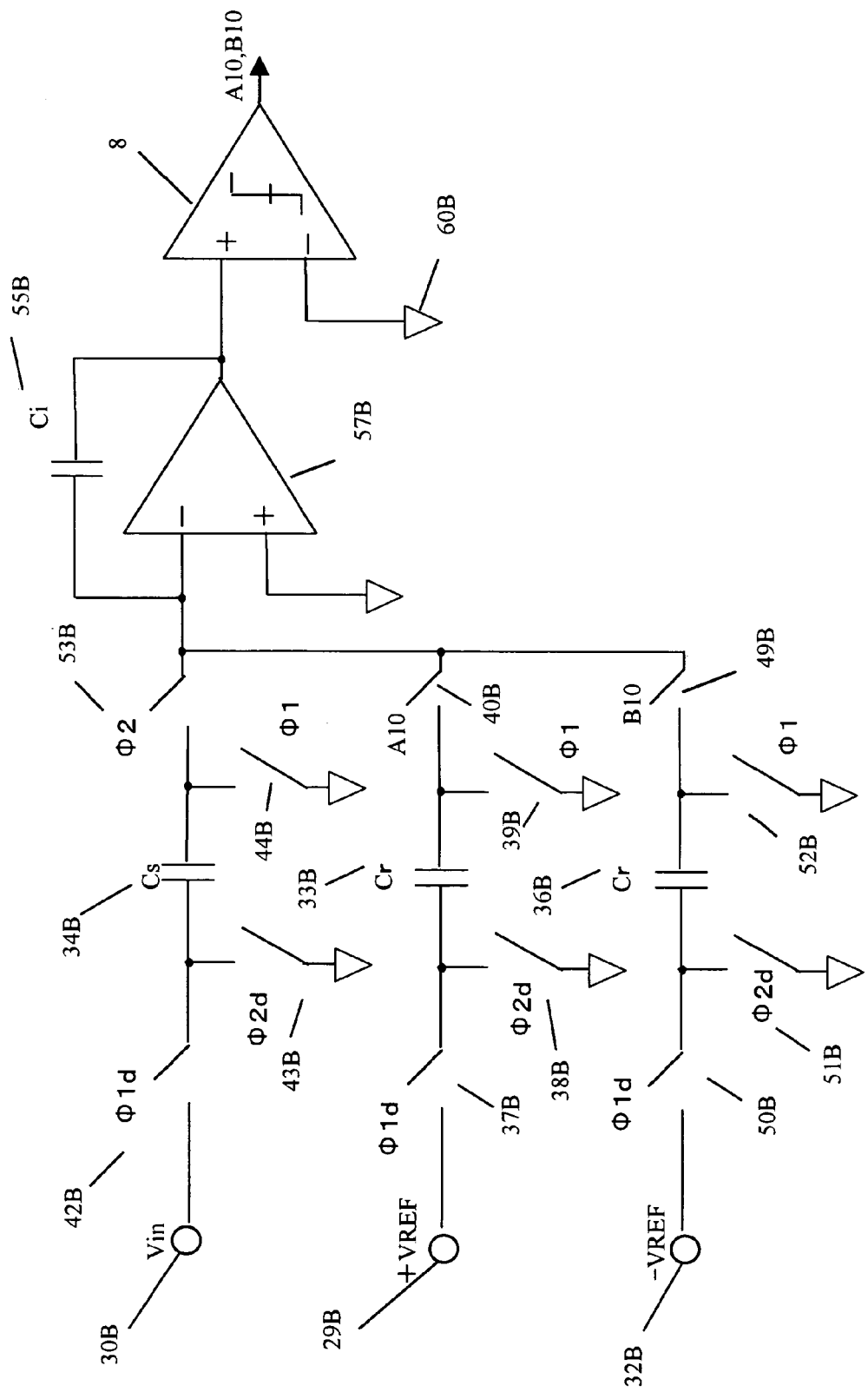
FIG. 6 is a circuit diagram showing a first concrete example of an integrator and a quantizer.

FIG. 6 shows an example of the integrator and the quantizer. In FIG. 6, reference numeral 30B represents an input terminal of a voltage Vin, reference numeral 29B represents a reference voltage terminal to which a positive reference voltage +VREF is inputted, and reference numeral 32B represents a reference voltage terminal to which a negative reference voltage −VREF is inputted. Moreover, reference numeral 34B represents a sampling capacitor (capacitance value Cs), reference numerals 33B and 36B represent feedback capacitances from the quantizer (capacitance value Cr), and reference numeral 55B represents an integral capacitance (capacitance value Ci). Moreover, reference numeral 57B represents an operational amplifier for integration, and reference numeral 8 represents the quantizer. Reference numeral 60B represents a common voltage, and reference numerals 42B, 43B, 44B, 53B, 37B, 38B, 39B, 40B, 50B, 51B, 52B and 49B represent switches. The switches 42B, 43B, 44B, 53B, 37B, 38B, 39B, 50B, 51B and 52B are turned on and off by the clocks φ1, φ1d, φ2 and φ2d shown in FIG. 11. The switches 40B and 49B are turned on and off in accordance with the output values A10 and B10 of the quantizer.

The output values A10 and B10 of the quantizer 8 are extracted as PDM (pulse density modulation) waves of the input Vin.

When the voltage Vin is supplied from the input terminal 30B, charges are stored in the sampling capacitor 34B in the sampling period (the high period of the clock φ1d). Then, in the integration period (the high period of the clock φ2d), the charges are transferred to the integral capacitance 55B. Likewise, the charges stored in the feedback capacitances 33B and 36B in the high period of the clock φ1d are added to the charges in the sampling capacitor 34B at the input portion of the operational amplifier 57B during the high period of the clock φ2d in accordance with the output value of A10 and B10 from the quantizer 8. At this time, there is manufacturing nonuniformity among each of the sampling capacitors 34B, the feedback capacitances 33B and 36B and the integral capacitances 55B, and the ratio is not always maintained constant. Moreover, since the relative values of the delta sigma modulators in the stages disagree with each other, it is difficult to achieve the ideal characteristic. This gravely affects the characteristic in the case of cascade-type delta sigma modulators. A primary object of the present invention is to reduce the influence of the characteristic degradation on this. According to the structure of the present invention, the influence of the characteristic degradation can be reduced.

The relative value disagreement between the delta sigma modulators in the stages means that the coefficient of the transfer function determined by the capacitance ratio or the like is shifted from the ideal due to manufacturing nonuniformity or the like and the relative relationship between the transfer function in the first stage and that in the second stage is shifted from the ideal.

The pulses φ1 and φ2 are nonoverlapping pulses. The switches that operate in accordance with the pulses φ1 and φ2 are switches for reliably transmitting the charges stored in the capacitance Cs and the capacitance Cr to the integral capacitance Ci. The pulses φ1d and φ2d are slightly delayed from the pulses φ1 and φ2, and leakage of charges can be reliably prevented by this.

Figure 7:
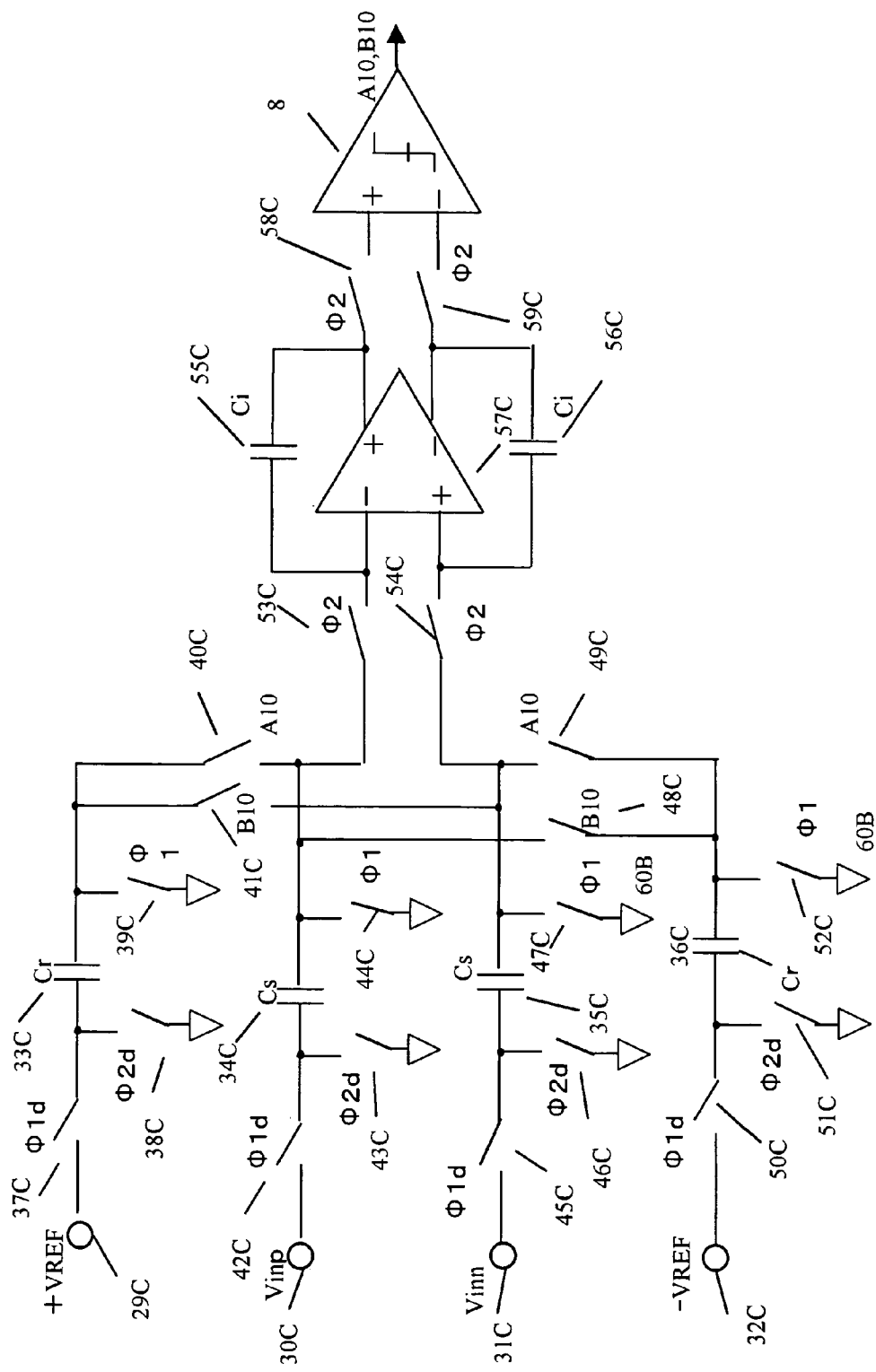
FIG. 7 is a circuit diagram showing a second concrete example of the integrator and the quantizer.

FIG. 7 shows an example of the integrator and the quantizer in fully differential delta sigma modulators. Fully differential delta sigma modulators are advantageous in distortion, the removal of common mode noise and the like. Description will be given with reference to FIG. 7.

In FIG. 7, reference numeral 8 represents the quantizer. Reference numeral 30C represents a positive phase input terminal to which a positive phase input voltage Vinp is applied. Reference numeral 31C represents a negative phase input terminal to which a negative phase input voltage Vinn is applied. Reference numeral 29C represents a positive phase reference voltage terminal to which a positive reference voltage +VREF is applied, and reference numeral 32C represents a negative phase reference voltage terminal to which a negative reference voltage −VREF is applied. Reference numerals 34C and 35C represent sampling capacitors (capacitance Cs), reference numerals 33C and 36C represent feedback capacitances (capacitance Cs) from the quantizer 8, and reference numerals 55C and 56C represent integral capacitances (capacitance Cs). Reference numeral 57C represents an operational amplifier for integration. Reference numerals 37C to 54C, 58C and 59C represent switches.

When the positive phase input voltage Vinp and the negative phase input voltage Vinn are supplied to the positive phase input terminal 30C and the negative phase input terminal 31, charges are stored in the sampling capacitors 34C and 35C in the sampling period φ1d, and the charges are transferred to the integral capacitances 55C and 56C in the integration period φ2d. Likewise, the charges stored in the feedback capacitances 33C and 36C in the sampling period φ1d are added to the charges stored in the sampling capacitors 34C and 35C at the input portion of the operational amplifier 57C in the integration period φ2d in accordance with the value A10 or B10 from the quantizer 8, and transferred to the integral capacitances 55C and 56C.

At this time, with respect to the capacitances 33C, 34C, 35C, 36C, 55C and 57C, the ratio is not always maintained constant because of manufacturing nonuniformity, and there is disagreement between the relative values of the modulators in the stages, so that it is difficult to achieve the ideal characteristic. This gravely affects the characteristic in the case of cascade delta sigma modulators. A primary object of the present invention is to reduce the influence of the characteristic degradation on this. According to the structure of the present invention, this influence of the characteristic degradation can be reduced.

The pulses φ1 and φ2 are nonoverlapping pulses. The switches that operate in accordance with the pulses φ1 and φ2 are switches for reliably transmitting the charges stored in the capacitance Cs and the capacitance Cr to the integral capacitance Ci. The pulses φ1d and φ2d are slightly delayed from the pulses φ1 and φ2, and leakage of charges can be reliably prevented by this.

In the structure of FIG. 1, one in which there is no feedback from the second integrator is also included in the present invention. That is, one in which a feedback path by the computing element 20 is omitted is also included in the present invention. This condition is a case where g2=0 in the expression (20), and no notch characteristic is provided (see claim 3). At this time, the quantization noise of the quantizer 19 in the succeeding stage also undergoes shaping to a fourth-order high frequency region.

When D1(Z)=D2(Z) and N1(Z)=N2(Z) in the expression (20), although the structure is simplest, the same fourth-order noise shaping can be performed on the quantizer 1 and the quantizer 2 (see claim 4).

Figure 3:
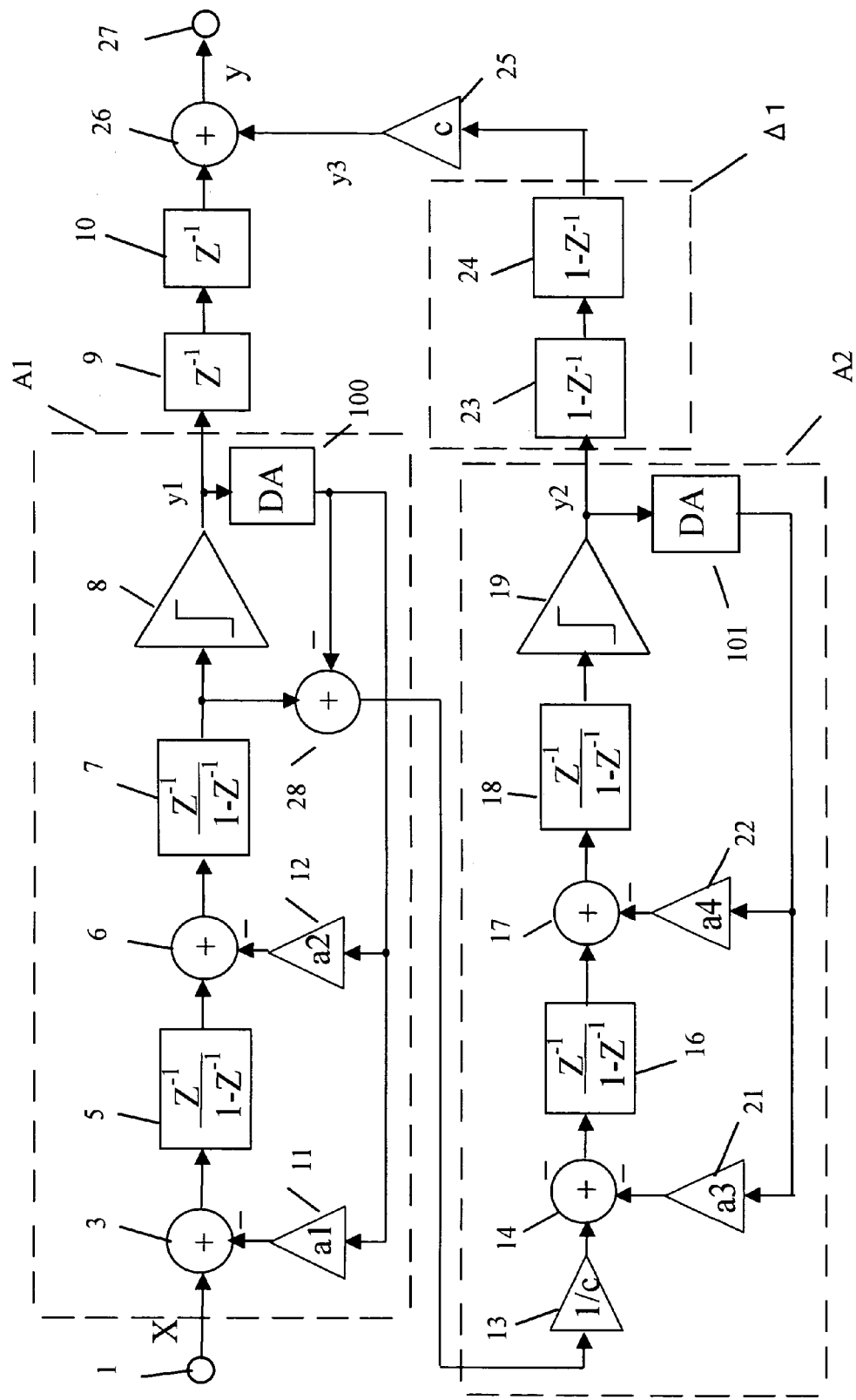
FIG. 3 is a block diagram showing a first example of the concrete structure of the prior art delta sigma modulating apparatus.
Figure 4:
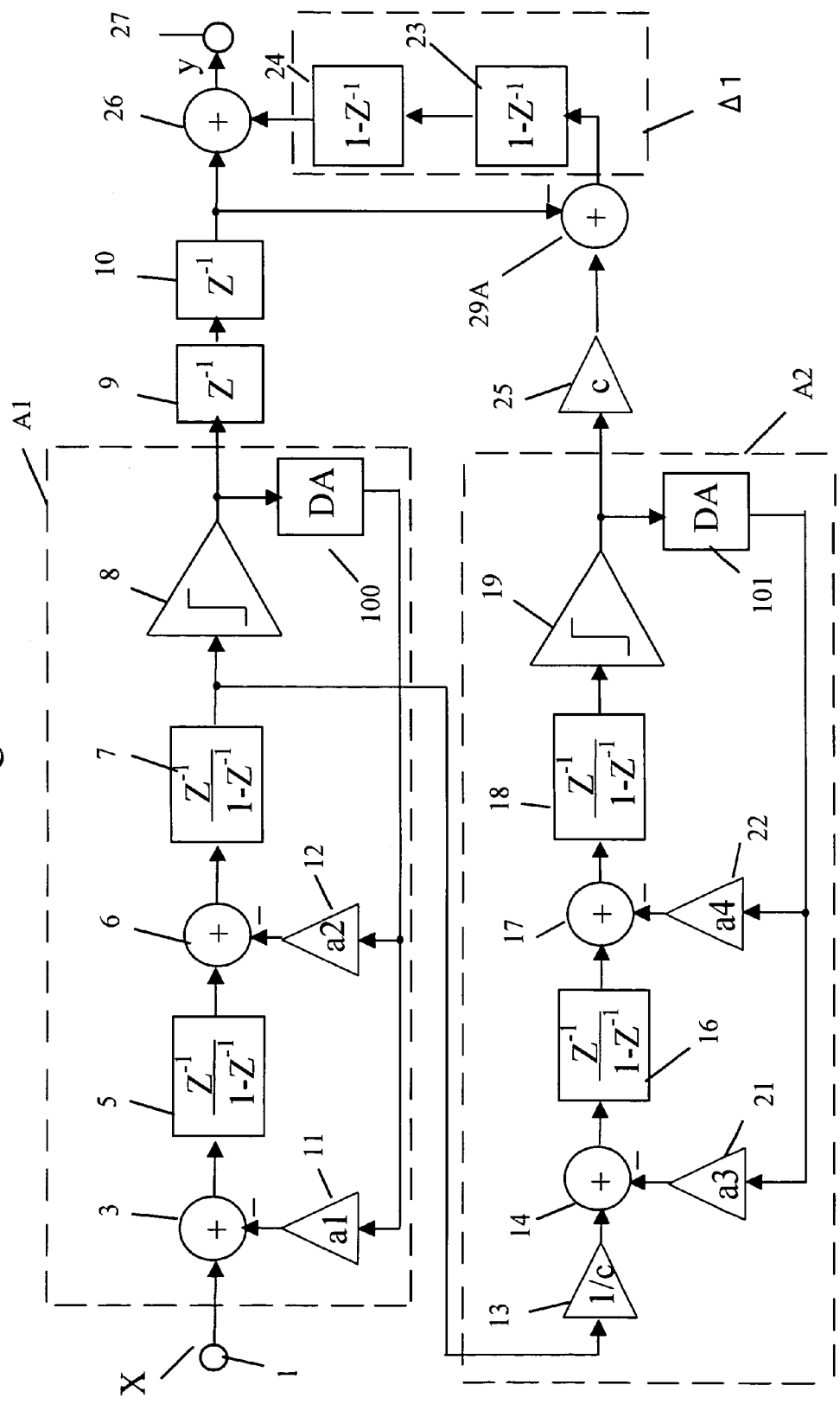
FIG. 4 is a block diagram showing a second example of the concrete structure of the prior art delta sigma modulating apparatus.

As described above, one having no notch characteristic is also included in the present invention, and when the structure of the present invention having no notch characteristic (one in which the computing element 20 is omitted from FIG. 1) is compared with the structure of the conventional example (FIG. 3), the adder 28 of the FIG. 3 of the conventional example is unnecessary in the structure of the present invention.

While the delta sigma modulators have a second-order structure in the above-described embodiment, they may have a third- or higher-order structure.

INDUSTRIAL APPLICABILITY

The delta sigma modulating apparatus according to the present invention produces effects that a delta sigma modulating apparatus can be provided that enables the realization of a high SN ratio by directly connecting the input of the quantizer of the preceding second-order delta sigma modulator to the succeeding second-order delta sigma modulator having a notch characteristic and performing fourth-order noise shaping in which the noise of the quantizer in the first stage is minimized and that a delta sigma modulating apparatus can be provided that reduces the characteristic degradation with respect to the disagreement between the modulators in the stages which is a defect of the cascade type, and is capable of realizing cost reduction; and is useful as a delta sigma analog/digital (AD) modulator or the like used in the fields of audio, communications and the like.

What is claimed is:

1. A delta sigma modulating apparatus comprising:
a first delta sigma modulator including a first and a second adder, a first and a second integrator, a first quantizer, a first digital-to-analog converter, and first, second, and third computing elements;
a second delta sigma modulator including a third and a fourth adder, a third and a fourth integrator, a second quantizer, a second digital-to-analog converter, and fourth, fifth, sixth, and seventh computing elements; and
a signal synthesizer that includes an eighth computing element and synthesizes an output signal of said first delta sigma modulator with an output signal of said second delta sigma modulator, wherein:
said first adder subtracts an analog output signal of said first digital-to-analog converter through said first computing element, from an externally inputted analog input signal,
said first integrator integrates an analog output signal of said first adder through said second computing element,
said second adder subtracts the analog output signal of said first digital-to-analog converter through said third computing element, from an analog output signal of said first integrator,
said second integrator integrates an analog output signal of said second adder,
said first quantizer outputs a digital signal corresponding to an analog output signal of said second integrator,
said first digital-to-analog converter outputs an analog signal corresponding to the digital output signal of the first quantizer to said first and third computing elements,
said third adder subtracts an analog output signal of said second digital-to-analog converter through said fifth computing element and an analog output signal of said fourth integrator from the analog output signal of said second integrator through said fourth computing element,
said third integrator integrates an analog output signal of said third adder through said sixth computing element,
said fourth adder subtracts an output signal of said second digital-to-analog converter through said seventh computing element from an analog output signal of said third integrator,
said fourth integrator integrates an analog output signal of said fourth adder
said second quantizer outputs a digital signal corresponding to an analog output signal of said fourth integrator,
said second digital-to-analog converter outputs an analog signal corresponding to the digital output signal of said second quantizer to said fifth and seventh computing elements,
said signal synthesizer adds a signal obtained by delaying the digital output signal of said first quantizer to a signal obtained by differentiating the digital output signal of said second quantizer and performing scaling through said eighth computing element, and outputs a result of the addition, and
when a feedback amount of an analog signal inputted from said first quantizer to said first adder is the same as a feedback amount of an analog signal inputted from said second quantizer to said third adder, the following relationship is satisfied:
a1=a3, a2=a4, c1=c2, and a gain coefficient of said eighth computing element =1/(b2c2), where:
a1 is a gain coefficient of said first computing element,
c1 is a gain coefficient of said second computing element,
a2 is a gain coefficient of said third computing element,
b2 is a gain coefficient of said fourth computing element,
a3 is a gain coefficient of said fifth computing element,
c2 is a gain coefficient of said sixth computing element, and
a4 is a gain coefficient of said seventh computing element.

2. A delta sigma modulating apparatus comprising:
a first delta sigma modulator including a first and a second adder, a first and a second integrator, a first quantizer a first digital-to-analog converter, and first, second, and third computing elements;
a second delta sigma modulator including a third and a fourth adder, a third and a fourth integrator, a second quantizer a second digital-to-analog converter, and fourth, fifth, sixth, and seventh computing elements; and
a signal synthesizer that includes an eighth computing element and synthesizes an output signal of said first delta sigma modulator with an output signal of said second delta sigma modulator, wherein:
said first adder subtracts an analog output signal of said first digital-to-analog converter through said first computing element, from an externally inputted analog input signal,
said first integrator integrates an analog output signal of said first adder through said second computing element,
said second adder subtracts the analog output signal of said first digital-to-analog converter through said third computing element from an analog output signal of said first integrator,
said second integrator integrates an analog output signal of said second adder,
said first quantizer outputs a digital signal corresponding to an analog output signal of said second integrator,
said first digital-to-analog converter outputs an analog signal corresponding to the digital output signal of the first quantizer to said first and third computing elements,
said third adder subtracts an analog output signal of said second digital-to-analog converter through said fifth computing element from an analog output signal of said second integrator through said fourth computing element,
said third integrator integrates an analog output signal of said third adder through said sixth computing element,
said fourth adder subtracts an output signal of said second digital-to-analog converter through said seventh computing element from an analog output signal of said third integrator,
said fourth integrator integrates an analog output signal of said fourth adder,
said second quantizer outputs a digital signal corresponding to an analog output signal of said fourth integrator,
said second digital-to-analog converter outputs an analog signal corresponding to the digital output signal of said second quantizer to said fifth and seventh computing elements,
said signal synthesizer adds a signal obtained by delaying the digital output signal of said first quantizer to a signal obtained by differentiating the digital output signal of said second quantizer and performing scaling through said eighth computing element, and outputs a result of the addition, and
when a feedback amount of an analog signal inputted from said first quantizer to said first adder is the same as a feedback amount of an analog signal inputted from said second quantizer to said third adder, the following relationship is satisfied:

$a1=a3$, $a2=a4$, $c1=c2$, and a gain coefficient of said eighth computing element $=1/(b2c2)$, where:

$a1$ is a gain coefficient of said first computing element,
$c1$ is a gain coefficient of said second computing element,
$a2$ is a gain coefficient of said third computing element,
$b2$ is a gain coefficient of said fourth computing element.
$a3$ is a gain coefficient of said fifth computing element,
$c2$ is a gain coefficient of said sixth computing element, and
$a4$ is a gain coefficient of said seventh computing element.

* * * * *